(12) United States Patent
Schier et al.

(10) Patent No.: US 11,247,275 B2
(45) Date of Patent: Feb. 15, 2022

(54) CUTTING TOOL

(71) Applicant: WALTER AG, Tubingen (DE)

(72) Inventors: Veit Schier, Echterdingen (DE); Dominic Diechle, Goppingen (DE)

(73) Assignee: WALTER AG, Tubingen (DE)

( * ) Notice: Subject to any disclaimer, the term of this patent is extended or adjusted under 35 U.S.C. 154(b) by 763 days.

(21) Appl. No.: 15/999,768

(22) PCT Filed: Feb. 16, 2017

(86) PCT No.: PCT/EP2017/053511
§ 371 (c)(1),
(2) Date: Aug. 20, 2018

(87) PCT Pub. No.: WO2017/140787
PCT Pub. Date: Aug. 24, 2017

(65) Prior Publication Data
US 2021/0213538 A1 Jul. 15, 2021

(30) Foreign Application Priority Data
Feb. 19, 2016 (EP) .................................. 16156516

(51) Int. Cl.
*B23B 27/14* (2006.01)
*C23C 14/08* (2006.01)
*C23C 14/35* (2006.01)
*C23C 28/04* (2006.01)
*C23C 28/00* (2006.01)

(52) U.S. Cl.
CPC .......... *B23B 27/148* (2013.01); *C23C 14/081* (2013.01); *C23C 14/35* (2013.01); *C23C 28/042* (2013.01); *C23C 28/044* (2013.01); *C23C 28/42* (2013.01); *B23B 2228/105* (2013.01)

(58) Field of Classification Search
CPC ..... B23B 27/14; B23B 27/148; C23C 14/081; C23C 28/042; C23C 28/044; C23C 28/42
USPC ................ 428/216, 336, 697, 699, 701, 702
See application file for complete search history.

(56) References Cited

U.S. PATENT DOCUMENTS

| | | | |
|---|---|---|---|
| 7,326,461 B2 * | 2/2008 | Sottke | .................... C04B 41/009 428/216 |
| 7,597,951 B2 * | 10/2009 | Bjormander | .......... C23C 16/403 428/702 |
| 8,119,226 B2 | 2/2012 | Reineck et al. | |
| 2006/0257691 A1 * | 11/2006 | Trinh | .................. C23C 14/3464 428/698 |

(Continued)

FOREIGN PATENT DOCUMENTS

| | | |
|---|---|---|
| DE | 102007030734 A1 | 1/2009 |
| EP | 1914331 A2 | 4/2008 |
| JP | 2010207915 A | 9/2010 |

*Primary Examiner* — Archene A Turner
(74) *Attorney, Agent, or Firm* — Corinne R. Gorski

(57) ABSTRACT

A cutting tool includes a base body and a coating applied thereto. For providing a cutting tool, having both a hard coating that also exhibits fracture toughness, the coating includes at least one oxide layer deposited in the PVD process, consisting of at least 10 alternating single coats of $Al_2O_3$ and $(Al_x, Me_{1-x})_2O_3$, where $0<x<1$, wherein Me is selected from one or more of the group of Si, Ti, V, Zr, Mg, Fe, B, Gd, La and Cr.

16 Claims, 1 Drawing Sheet

(56) References Cited

U.S. PATENT DOCUMENTS

2008/0131219 A1* 6/2008 Reineck ................ C23C 28/044
  407/119
2009/0207915 A1 10/2009 Rainer
2010/0183884 A1* 7/2010 Schier ................... C23C 30/005
  428/702

* cited by examiner

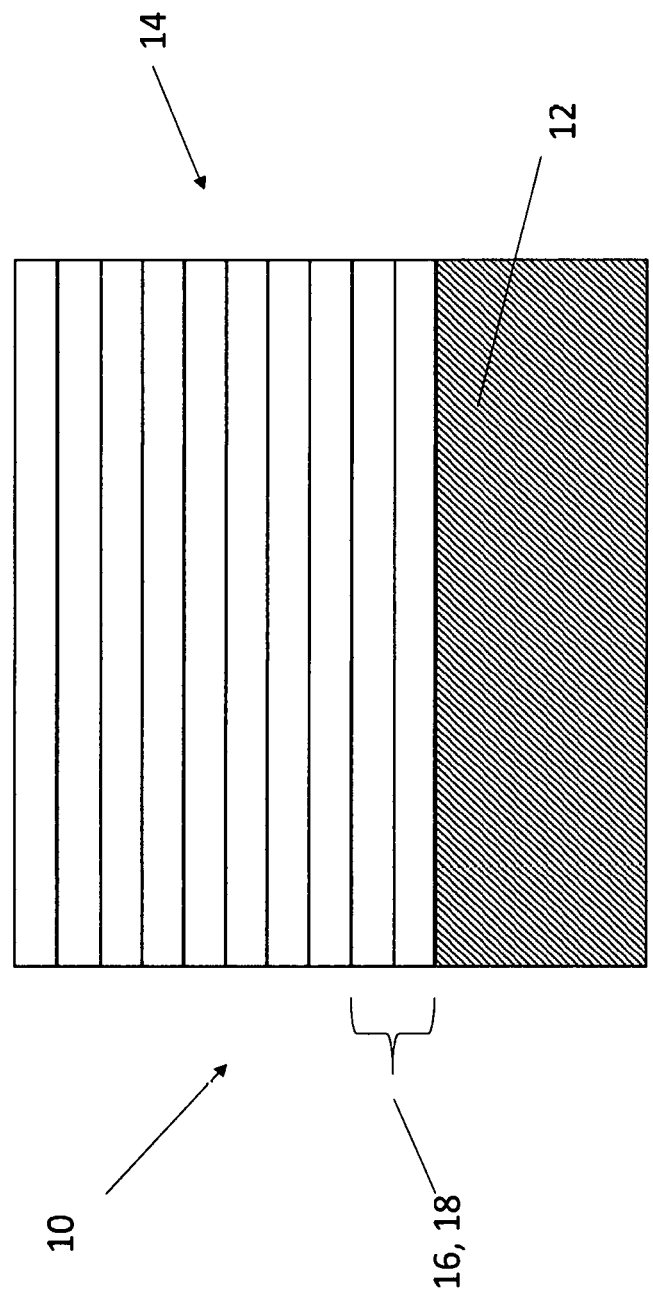

CUTTING TOOL

RELATED APPLICATION DATA

This application is a § 371 National Stage Application of PCT International Application No. PCT/EP2017/053511 filed Feb. 16, 2017 claiming priority to EP Application No. 156156516.3 filed Feb. 19, 2016.

TECHNICAL FIELD

The present invention relates to a cutting tool having a base body and a coating applied thereto.

BACKGROUND

Cutting tools, including metal cutting tools, consist of a base body which is produced for example from hard metal, cermet, steel, high-speed steel or cubic boron nitride. Frequently a single-layer or multi-layer coating is applied to the substrate to improve the cutting characteristics as well as to increase the service lives. Such a single-layer or multi-layer coating includes for example metallic hard material layers, oxide layers, nitride layers and the like. The methods employed to apply the coating are the CVD process (chemical vapour deposition) and/or PVD process (physical vapour deposition). Multiple layers within a coating can be applied exclusively by means of CVD processes, exclusively by means of PVD processes or by a combination of those processes. CVD processes provide substantially stable phases of the desired compounds whereas PVD processes also make it possible to apply metastable phases of compounds.

In regard to PVD processes a distinction is drawn between various variants in such processes such as magnetron sputtering, arc vapour deposition (arc PVD), ion plating, electron beam vapour deposition and laser ablation. Of these PVD processes there are in turn different variations and modifications. Applying different variants of PVD processes as well as variations of the deposition parameters within one variant of a PVD process may render a layer deposited thereby different structural, morphological and/or physical properties even with an otherwise identical chemical composition of the layer.

DE 10 2007 030 734 describes a cutting tool with a base body and a single-layer or multi-layer coating applied thereto. The coating includes at least one two-phase or multi-phase layer, comprising at least two different phases of metal oxide, wherein the at least one two-phase or multi-phase layer is electrically conductive.

Schmücker et al. (2001), "Constitution and crystallization behavior of ultrathin physical vapor deposited (PVD) $Al_2O_3$/$SiO_2$ laminates", Journal of the European Ceramic Society 21 (2001); 2503-2507, describe the production of very thin $Al_2O_3$/$SiO_2$ multi layers by means of PVD using two targets and electron beam deflection of a single electron beam.

When applying oxide layers, in particular when using PVD processes, the problem arises that such layers have a high degree of hardness whereas they are brittle in general. For chip-removing manufacturing processes, in particular milling operations, it is however necessary that the cutting tools apart from the hardness, imparted by the oxide, also show a high degree of toughness which amongst others increases the service life of the tool.

Sputtered $Al_2O_3$/$SiO_2$ single-layer coatings with a nanocrystalline γ-structure as well as single $(AlCr)_2O_3$ layers deposited by means of arc PVD, having proportions of α and γ, however, having a high fraction of droplets, or $(AlCr)_2O_3$ single layers with proportions of α and/or γ, deposited by magnetron sputtering, have been suggested so far for solving this problem. Although these coatings provide an improvement with respect to fracture toughness to some extent, no satisfying solution could be provided, yet, with respect to the problem of the high brittleness, in particular for milling cutters.

SUMMARY

In view of this prior art, the object of the present invention was that of providing a cutting tool, having both a hard coating that also exhibits fracture toughness.

This object according to the invention is attained by a cutting tool as set out at the beginning, wherein the coating comprises at least one oxide layer deposited in the PVD process, consisting of at least 10 alternating single coats of $Al_2O_3$ and $(Al_x, Me_{1-x})_2O_3$ where $0<x<1$, wherein Me is selected from one or more of the group of Si, Ti, V, Zr, Mg, Fe, B, Gd, La and Cr.

Such a coating has been shown to have an increased toughness, in particular an increased fracture toughness, which also goes along with improved cutting properties and increased service life, in particular in comparison to pure aluminium oxide layers.

The reason for the increased fracture toughness of the coating according to the invention is not yet understood. It is however assumed to be associated with stress conditions within the layers, the grain sizes, phase transitions, grain boundary phases, defect sizes and defect densities, deformations of the crystal lattice caused by integrating Me atoms, layer boundaries as well as layer thicknesses.

In an embodiment, the coating comprises several oxide layers consisting of single coats according to the invention.

In an embodiment, the thicknesses of the single coats in an oxide layer consisting of single coats are each identical.

In an embodiment, the thicknesses of the single coats in the oxide layer consisting of single coats are 2 nm to 200 nm, preferably 3 nm to 50 nm, particularly preferably 4 nm to 10 nm. Through these layer thicknesses the fracture toughness is particularly high.

In an embodiment, the oxide layer consists of 10 to 1000 single coats, preferably of 100 to 600 single coats, particularly preferably of 300 to 500 single coats. In particular the fracture toughness is increased with such a number of single coats.

In an embodiment, the overall layer thickness of the oxide layer consisting of the single coats is from 0.1 urn to 8 μm, preferably 0.3 μm to 4 μm, particularly preferably 0.4 urn to 2 μm. It has been shown that the wear properties are positively affected by such layer thicknesses while this is not the case with smaller layer thicknesses and whereas larger layer thicknesses cause high compressive stresses.

In an embodiment, the fraction of Me in the oxide layer consisting of the single coats is in the range of from 0.3 at. % to 5.4 at. %, preferably in the range of from 1.3 at. % to 2.0 at. %. Particularly within these ranges an increase in fracture toughness is observable without the formation of further Me oxide phases.

In an embodiment, Me is selected among Si, Ti, V, Zr, Mg, Fe, Cr and B, particularly preferably Me is Si. It has been shown that within a layer of aluminium oxide integrating one of the aforementioned further metals may significantly increase the fracture toughness in comparison to a layer of pure aluminium oxide. This could be shown in particular for Si.

In an embodiment, the oxide layer consisting of the single coats is produced by means of sputtering, preferably dual magnetron sputtering or HIPIMS (high power impulse magnetron sputtering). These processes are special PVD processes not resulting In a formation of droplets, in particular in comparison to the arc PVD process. This has been proven to be particularly advantageous for the production of the oxide layer consisting of the single layers. A particular good adjustability for a respective use is possible through the changed microstructure, a different crystal structure and/or different stress conditions of the surface, caused by these production methods.

In an embodiment for the manufacture of the oxide layer consisting of the single coats at least one Al target and at least one AlMe target are used. This also encompasses the use of so-called segmented targets wherein one half corresponds to the Al target and the other half corresponds to the AlMe target. When applying the single coats such a target is mounted such that the separating line between the two halves of the target is parallel to the rotational axis of the substrate table.

In an embodiment, the AlMe target consists of from 1 at. % Me to 16 at. % Me and from 99 at. % Al to 84 at. % Al, preferably 4 at. % Me to 6 at. % Me and from 96 at. % Al to 94 at. % Al. The particularly preferred single coats of $(Al_x, Me_{1-x})_2O_3$ in the oxide layers with a low fraction of Me may be produced thereby.

In an embodiment, between the base body and the oxide layer consisting of the single coats at least one further layer is present, being or comprising a nitride, preferably TiN, TiCN, TiAlN, AlCrN, TiSiN, TiAlSiN, TiAlCrN. This layer has a high degree of hardness as well as a high modulus of elasticity and in combination with an oxide layer consisting of alternating single coats and arranged directly on top of it contributes to the wear reducing properties of the overall coating.

In an embodiment, the layer that is a nitride or comprises a nitride has a thickness of from 1 μm to 15 μm, preferably from 3 μm to 7 μm. Such layer thicknesses in combination with the layer consisting of single coats result in a particular good wear resistance.

In an embodiment, several oxide layers consisting of single coats as described above are arranged on top each other, each separated through a further layer which is a nitride or comprises a nitride, preferably TiN, TiCN, TiAlN, AlCrN, TiSiN, TiAlSiN, TiAlCrN.

In an embodiment, the coating comprises 1 to 7 oxide layers consisting of single coats and 1 to 8 layers consisting of a nitride or comprising a nitride, preferably TiN, TiCN, TiAlN, AlCrN, TiSiN, TiAlSiN, TiAlCrN. In an embodiment below the lowermost oxide layer consisting of single coats and on top of the uppermost oxide layer consisting of single coats one coat being or comprising a nitride is present, preferably TiN, TiCN, TiAlN, AlCrN, TiSiN, TiAlSiN, TiAlCrN.

In an embodiment, the oxide layer consisting of the single coats has a Vickers hardness in the range of from 1000 HV to 4000 HV, preferably of from 2000 HV to 3500 HV, particularly preferably of from 2600 HV to 3000 HV. It has been shown that oxide layers having such Vickers hardnesses are particularly wear resistant.

In an embodiment, the single coats of $(Al_x, Me_{1-x})_2O_3$ of the oxide layer consisting of single coats are single phase or multi-phase. Preferably, the single coats consisting of $(Al_x, Me_{1-x})_2O_3$ of the oxid layer consisting of single coats are single phase.

In an embodiment, the crystal structure of the coats of $(Al_x, Me_{1-x})_2O_3$ of the oxide layer consisting of single coats is equal to that of the single coats of $Al_2O_3$.

In an embodiment, the single coats of $Al_2O_3$ of the oxide layer consisting of single coats are coats of γ aluminium oxide. In specific embodiments the crystal structure of the single coats consisting of $(Al_x, Me_{1-x})_2O_3$ has the same or a different crystal structure. Thus, in an embodiment, the single coats of $Al_2O_3$ and the single coats of $(Al_x, Me_{1-x})_2O_3$ of the oxide layer consisting of single coats are both single phase and have both a γ crystal structure.

Further advantages, features and embodiments of the present invention will be described on the basis of the following examples.

BRIEF DESCRIPTION OF THE DRAWINGS

FIG. 1 is a cross-section of the cutting tool according to the present disclosure.

DETAILED DESCRIPTION

Referring to FIG. 1, a cutting tool 10 has base body 12 and a hard coating 14 that also exhibits fracture toughness. The coating includes at least one oxide layer deposited in the PVD process, consisting of at least 10 alternating single coats 16, 18 of either $Al_2O_3$ and/or $(Al_x, Me_{1-x})_2O_3$, wherein 0<x<1, and wherein Me is selected from one or more of the group of Si, Ti, V, Zr, Mg, Fe, B, Gd, La and Cr.

Example 1: Coating of Substrates

For investigating the production of the oxide layers having alternating single coats and in order to compare these with known single layers of $Al_2O_3$, different coatings were applied to base bodies.

In all examples the same base bodies were used. These are base bodies having a geometry of S-15 in accordance with ISO naming, having a mirror polished surface as well as a proportion of Co of 10 wt.-% and 90 wt.-% WC.

In order to eliminate effects from underlying layers, with respect to the determination of fracture toughness multi-coat layers have peen applied directly to a base body (substrate) and no further layers have been arranged above or below.

Experiment A: [$Al_2O_3$—$(AlSi)_2O_3$] Oxide Layer

Onto the above described base body the following oxide layer has been applied:

[$Al_2O_3$ $(AlSi)_2O_3$] oxide layer having 360 essentially alternating single coats
PVD process: Dual magnetron sputtering (dMS)
Targets: Target 1: Al; target size: 800×200 mm
  Target 2: AlSi where Al:Si is 95:5 (at. %); target size: 800×200 mm
Deposition: Temperature: 550° C.
  0.43 Pa argon partial pressure
  Reactive gas: Oxygen (partial pressure: $4 \times 10^{-5}$ mbar)
  Power (dMs): 30 kW
  Operating point: 480 V
  Bias current: 6.5 A
  Substrate bias voltage: 125 V unipolar (45 kHz, 10 is offtime)
The thickness of the single coats was about 4.4 nm.
The oxide layer of Experiment A was analyzed with XRD and only gamma phase peaks were detected. Both the $Al_2O_3$ and $(AlSi)_2O_3$ single coats can therefore be concluded to be of single phase gamma structure.

Experiment B: $Al_2O_3$ Single Layer

The production was—if not indicated otherwise—under the same conditions as in example A. However, two targets have been used, consisting exclusively of aluminium (Al):
$Al_2O_3$ single layer
PVD process: Dual magnetron sputtering (dMS)
Targets: Target 1: Al; target size: 800×200 mm
  Target 2: Al, target size: 800×200 mm
Deposition:
  Power (DMS): 20 kW
  Operating point: 510 V
  Bias current: 5.5 A

Example C: $Al_2O_3$ Single Layer by the CVD Process

For this comparative example instead using the PCD process for coating the body of hard metal, a conventional thermal CVD process has been applied.

A summary of the production conditions is provided in the table 1 below.

TABLE 1

| Experiment | Target 1 | Target 2 | Layer | Process |
|---|---|---|---|---|
| A | Al | AlSi (95 at. %: 5 at. %) | $(Al_{95}, Si_5)_2O_3$ + $Al_2O_3$ | PVD (dMS) |
| B | Al | Al | $Al_2O_3$ | PVD (dMS) |
| C | — | — | $Al_2O_3$ (CVD) | CVD |

Example 2: Comparison of Properties of the Coatings

For comparing the properties of the coatings the following parameters have been measured:

Fracture Toughness:

Using a Vickers type indenter (a four-sided square-based pyramid having an included angle of) 136° has been pushed onto the surface for 20 s. The (maximum) load for the indentations (test load) was 200 N. The applied load increase and load decrease was 20 N/s without holding time. During the application of the load cracks were formed within the coating. Upon release of the load images were produced by means of scanning electron microscopy and the crack lengths $l_1$ to $l_4$ visible on the surface and extending from the four corners of the indentation, were measured.

A HPG 2500/1 apparatus from Gesellschaft für Fertigungstechnik and Entwicklung Schmalkalden mbH was used for producing the indentations.

For each example from 5 to 11 Vickers indentations were produced. The crack length of the single cracks was determined by a commercially available software (AnalySIS docu from Olympus Soft Imaging Solutions GmbH) and the mean crack length (arithmetic average) $l_{layer}$ was calculated thereof.

The mean crack length $l_{layer}$ was used as a measure for the resistance against crack propagation of the hard material layer applied by means of PVD.

Vickers Hardness:

The Vickers hardness was determined by means of nano indentation (load-depth graph). The apparatus used was a Helmut Fischer GmbH, Sindelfingen, Germany, Picodentor HM500. The maximum force used was 15 mN, the time period for load increase and load decrease was 20 seconds each and the holding time was 10 seconds. After having applied the load using the Vickers indenter as described above, the length of the diagonal lines $d_1$ and $d_2$ of the projected cross-sectional area of the impressions were measured. Using the measures of the diagonal lines and calculating the mean diagonal (arithmetic average) the Vickers hardness was calculated.

Reduced Modulus of Elasticity:

The reduced modulus of elasticity was determined by means of nano indentation (load-depth graph) as described for determining the Vickers hardness.

Thickness:

Determining the thickness was done using the calotte grinding. Thereby a steel ball was used having a diameter of 30 mm for grinding the dome shaped recess and further the ring diameter was measured.

The results of these measurements are summarized in the table 2 below:

TABLE 2

| Example | Layer | Hardness/ HV | Reduced modulus E/GPa | Thickness/ μm | Crack length/ μm |
|---|---|---|---|---|---|
| A | $(Al_{95}, Si_5)_2O_3$ + $Al_2O_3$ | 2837 | 334 | 1.6 | 64.9 |
| B | $Al_2O_3$ | 2847 | 344 | 1.3 | 70.2 |
| C | CVD | — | — | 9.5 | 170 |

For determining the crack length the test load was set to be 200 N for these examples, as less load would lead to short cracks being difficult to measure and difficult to compare, while greater load caused spalling of the coat.

The invention claimed is:

1. A cutting tool having a base body and a coating applied thereto, wherein the coating comprises at least one oxide layer deposited in the PVD process, consisting of at least 100 alternating single coats of $Al_2O_3$ and $(Al_x, Me_{1-x})_2O_3$ where $0<x<1$, wherein Me is selected from one or more of the group of Si, Ti, V, Zr, Mg, Fe, B, Gd, La and Cr, wherein the crystal structure of the single coats consisting of $(Al_x, Me_{1-x})_2O_3$ has the same crystal structure as the single coats of $Al_2O_3$.

2. The cutting tool according to claim 1, wherein the single coats of $(Al_x, Me_{1-x})_2O_3$ of the oxide layer consisting of single coats are single phase.

3. The cutting tool according to claim 1, wherein the single coats of $Al_2O_3$ of the oxide layer consisting of single coats have a γ crystal structure.

4. The cutting tool according to claim 1, wherein the single coats of $Al_2O_3$ of the oxide layer consisting of single coats have a γ crystal structure and the crystal structure of the single coats consisting of $(Al_x, Me_{1-x})_2O_3$ has the same crystal structure as the single coats of $Al_2O_3$.

5. The cutting tool according to claim 1, wherein the thickness of the single coats is 2 nm to 200 nm.

6. The cutting tool according to claim 1, wherein the oxide layer consists of 100 to 1000 single coats.

7. The cutting tool according to claim 1, wherein the overall layer thickness of the oxide layer consisting of the single coats is from 0.1 μm to 8 μm.

8. The cutting tool according to claim 1, wherein the fraction of Me in the oxide layer consisting of the single coats is in the range of from 1.3 at. % to 2.0 at. %.

9. The cutting tool according to claim 1, wherein Me is selected from Si, Ti, V, Zr, Mg, Fe, Cr, and B.

10. The cutting tool according to claim 1, wherein the oxide layer consisting of the single coats is produced by means selected from sputtering, dual magnetron sputtering and HIPIMS (high power impulse magnetron sputtering).

11. The cutting tool according to claim 1, wherein for the manufacture of the oxide layer consisting of the single coats at least one Al target and at least one AlMe target are used.

12. The cutting tool according to claim 1, wherein the AlMe target contains from 1 at. % Me to 16 at. % Me and from 99 at. % Al to 84 at. % Al.

13. The cutting tool according to claim 1, wherein between the base body and the oxide layer consisting of the single coats at least one further layer is present, being or comprising a nitride selected from TiN, TiCN, TiAlN, AlCrN, TiSiN, TiAlSiN, and TiAlCrN.

14. The cutting tool according to claim 1, wherein the oxide layer consisting of the single coats has a Vickers hardness in the range of from 1800 HV to 4000 HV.

15. A cutting tool having a base body and a coating applied thereto, wherein the coating comprises at least one oxide layer deposited in the PVD process, consisting of at least 10 alternating single coats of $Al_2O_3$ and $(Al_x, Me_{1-x})_2O_3$ where $0<x<1$, a thickness of the single coats being 2 nm to 200 nm, and wherein Me is selected from one or more of the group of Si, Ti, V, Zr, Mg, Fe, B, Gd, La and Cr, wherein the crystal structure of the single coats consisting of $(Al_x, Me_{1-x})_2O_3$ has the same crystal structure as the single coats of $Al_2O_3$.

16. A cutting tool having a base body and a coating applied thereto, wherein the coating comprises at least one oxide layer deposited in the PVD process, consisting of at least 10 alternating single coats of $Al_2O_3$ and $(Al_x, Me_{1-x})_2O_3$ where $0<x<1$, an overall layer thickness of the oxide layer consisting of the single coats being from 0.1 μm to 8 μm, and wherein Me is selected from one or more of the group of Si, Ti, V, Zr, Mg, Fe, B, Gd, La and Cr, wherein the crystal structure of the single coats consisting of $(Al_x, Me_{1-x})_2O_3$ has the same crystal structure as the single coats of $Al_2O_3$.

* * * * *